US009759749B2

(12) United States Patent
Ausserlechner

(10) Patent No.: US 9,759,749 B2
(45) Date of Patent: *Sep. 12, 2017

(54) MAGNETIC FIELD CURRENT SENSORS, SENSOR SYSTEMS AND METHODS

(71) Applicant: Infineon Technologies AG, Neubiberg (DE)

(72) Inventor: Udo Ausserlechner, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

This patent is subject to a terminal disclaimer.

(21) Appl. No.: 15/373,534

(22) Filed: Dec. 9, 2016

(65) Prior Publication Data

US 2017/0089956 A1 Mar. 30, 2017

Related U.S. Application Data

(62) Division of application No. 14/261,939, filed on Apr. 25, 2014.

(51) Int. Cl.
*G01R 33/09* (2006.01)
*G01B 7/30* (2006.01)
(Continued)

(52) U.S. Cl.
CPC ....... *G01R 15/205* (2013.01); *G01R 19/0092* (2013.01); *G01R 33/091* (2013.01)

(58) Field of Classification Search
CPC .................................................. G01R 33/09
(Continued)

(56) References Cited

U.S. PATENT DOCUMENTS 5,747,997 A * 5/1998 Dahlberg et al. ............. 324/252
7,164,263 B2 1/2007 Yakymyshyn et al.
(Continued)

FOREIGN PATENT DOCUMENTS

CN    101788596 A    7/2010
CN    201622299 U    11/2010
CN    102043083 A    6/2011

OTHER PUBLICATIONS

"TMR Linear Magnetic Field Sensor." Muitidimension Technology Co., Ltd. 1 page, available at www.multidimensiontech.com as of Apr. 25, 2014.
(Continued)

*Primary Examiner* — Bot Ledynh
(74) *Attorney, Agent, or Firm* — Eschweiler & Potashnik, LLC

(57) ABSTRACT

Embodiments relate to coreless magnetic field current sensors, systems and methods, such as magnetoresistive sensors, systems and methods, to sense current flow in a conductor via a related magnetic field. In an embodiment, a current sensor system for sensing a current in a conductor from a magnetic field induced thereby, comprising a plurality N of magnetoresistive (MR) sensors arranged on a circle concentric to a center of the conductor and spaced apart from one another by 360 degrees/N, wherein each MR sensor has a sensitivity plane and is responsive to a projection of the magnetic field into the sensitivity plane, the sensitivity planes of the plurality of MR sensors being parallel, and wherein the plurality of MR sensors are arranged relative to the conductor such that the magnetic field has a non-vanishing component parallel to the sensitivity plane; at least one magnetic element arranged to provide a bias magnetic field on the plurality of MR sensors; and circuitry coupled to the plurality of MR sensors to determine the
(Continued)

current in the conductor by combining signals from each of the plurality of MR sensors.

15 Claims, 14 Drawing Sheets

(51) Int. Cl.
    *G01R 27/02*      (2006.01)
    *G01R 27/08*      (2006.01)
    *G01R 15/20*      (2006.01)
    *G01R 19/00*      (2006.01)

(58) Field of Classification Search
    USPC ........................................................ 324/252
    See application file for complete search history.

(56) References Cited

U.S. PATENT DOCUMENTS

2008/0224695 A1*   9/2008   Leroy et al. ................... 324/252
2013/0300409 A1*   11/2013   Deak et al. ................... 324/252

OTHER PUBLICATIONS

Notice of Allowance dated Oct. 17, 2016 for U.S. Appl. No. 14/261,939.
Final Office Action dated Jul. 8, 2016 for U.S. Appl. No. 14/261,939.
Non-Final Office Action dated Feb. 2, 2016 for U.S. Appl. No. 14/261,939.

* cited by examiner

Center of conductor

MAGNETIC FIELD CURRENT SENSORS, SENSOR SYSTEMS AND METHODS

REFERENCE TO RELATED APPLICATION

This application is a divisional of U.S. application Ser. No. 14/261,939 filed on Apr. 25, 2014, the contents of which are incorporated by reference in their entirety.

FIELD

Embodiments relate generally to current sensors, and more particularly to coreless magnetic field sensors, systems and methods for sensing current flow in a conductor via a related magnetic field.

BACKGROUND

Current sensors are used in a wide variety of applications and industries. The sensors can comprise magnetic field sensors to detect a magnetic field related to a current flowing in a conductor and infer the current based on the field measurement. Magnetic field sensors can comprise Hall effect sensors, comprising ordinary Hall plates or vertical Hall effect sensors, or magnetoresistive (MR) sensors, such as giant magnetoresistors (GMRs), tunneling-magneto resistors (TMRs), anisotropic magnetoresistors (AMRs) and colossal magnetoresistors (CMRs), among others. Generally speaking, MRs are devices in which an electrical resistance changes in response to an applied magnetic field. In some MRs (e.g., GMRs, TMRs, CMRs), a reference direction in the sensor is defined by a pinned layer, whereas in other MRs (e.g., AMRs) it is defined by the direction of current flow irrespective of the polarity.

Many conventional magnetic field current sensors include a magnetic core in which the current is guided by permeable magnetic parts. Magnetic field sensor elements arranged proximate the core can detect the current by sensing the magnetic field induced thereby. Drawbacks of these sensors include heat generation due to magnetic losses in the core, increased manufacturing costs, large sizes, increased weights and poor performance. Additionally, in conventional current sensors the conductor is typically covered by a non-conducting coating plus harness which may serve as a ground shield. These coatings (e.g., soft elastomers) have poorly defined geometries which could lead to errors in current measurements. Other drawbacks of these sensors include the limited suppression of background disturbances which could also lead to a reduction in the accuracy of the measured current.

SUMMARY

Embodiments relate to coreless magnetic field current sensors, systems and methods, such as magnetoresistive sensors, systems and methods, to sense current flow in a conductor via a related magnetic field. In an embodiment, a current sensor system for sensing a current in a conductor from a magnetic field induced thereby, comprising a plurality N of magnetoresistive (MR) sensors arranged on a circle concentric to a center of the conductor and spaced apart from one another by 360 degrees/N, wherein each MR sensor has a sensitivity plane and is responsive to a projection of the magnetic field into the sensitivity plane, the sensitivity planes of the plurality of MR sensors being parallel, and wherein the plurality of MR sensors are arranged relative to the conductor such that the magnetic field has a non-vanishing component parallel to the sensitivity plane; at least one magnetic element arranged to provide a bias magnetic field on the plurality of MR sensors; and circuitry coupled to the plurality of MR sensors to determine at least one parameter of the current in the conductor by combining signals from each of the plurality of MR sensors.

In an embodiment, a method comprises arranging a sensor system proximate a conductor, the sensor system comprising a plurality N of magnetoresistive (MR) sensors arranged on a circle concentric to a center of the conductor and spaced apart from one another by 360 degrees/N; providing a bias magnetic field on the plurality of MR sensors; causing a current to flow in the conductor; and sensing a magnetic field induced by the current and acting on each of the plurality of MR sensors; and estimating at least one parameter of the current in the conductor by combining signals related to the magnetic field from each of the plurality of MR sensors.

BRIEF DESCRIPTION OF THE DRAWINGS

The invention may be more completely understood in consideration of the following detailed description of various embodiments of the invention in connection with the accompanying drawings, in which.

Figure 1:
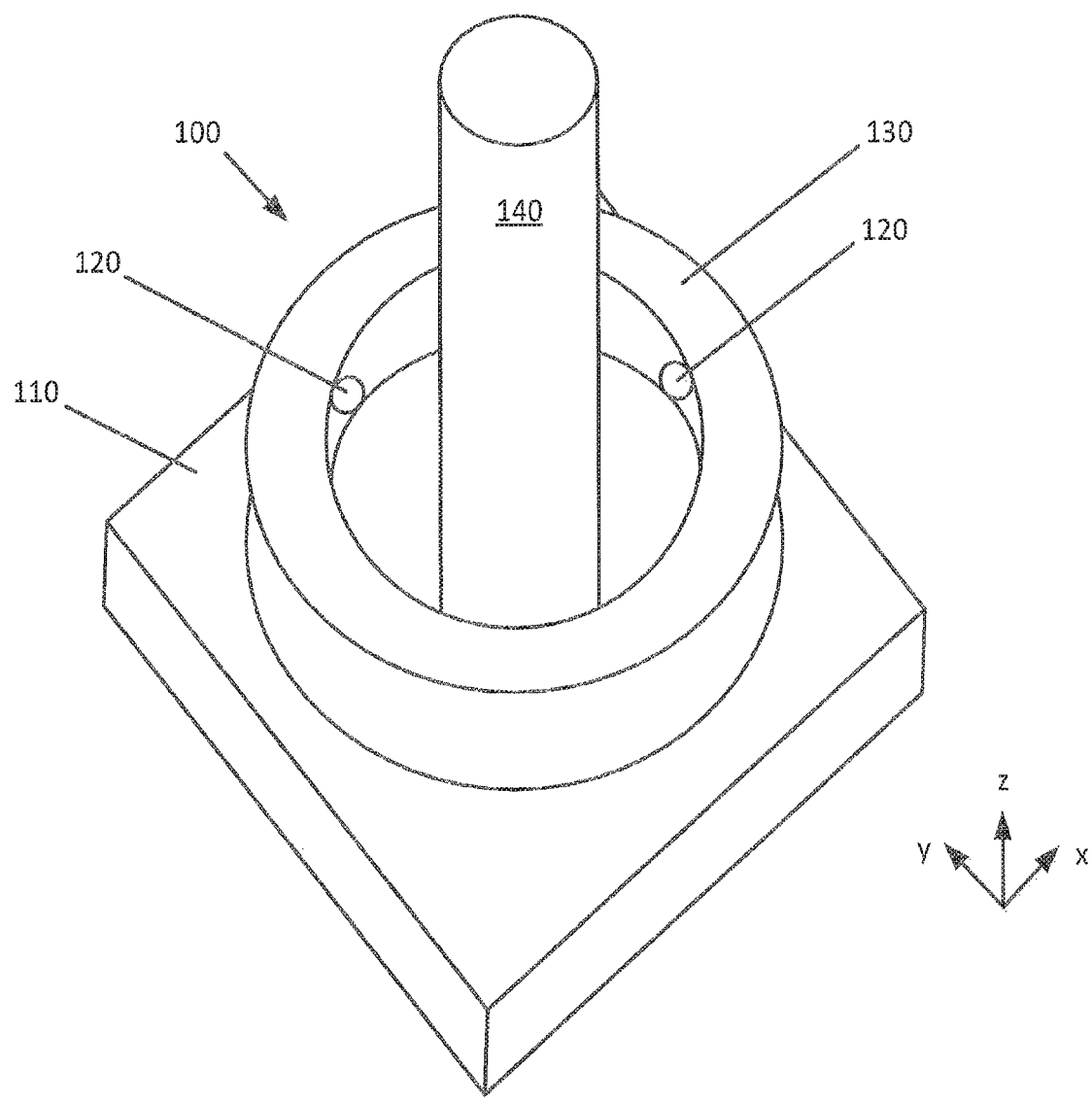
FIG. 1 is a perspective view of a sensor system and a conductor according to an embodiment.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

Embodiments relate to coreless magnetic field current sensors, sensor systems and methods that can be arranged proximate a conductor to determine a parameter of a current flow in the conductor via a magnetic field induced by the current flow. In some embodiments, the sensors can be high current sensors, capable of sensing currents in a range of about 1 Amp (A) to about 100 kA or more. Embodiments can comprise magnetoresistors and magnetoresistive sensors.

In embodiments, a sensor system comprises a support structure comprising at least one aperture through which a conductor can be arranged, and at least two sensors and a magnetic element arranged on the support structure relative to a positional axis of the conductor. In embodiments, the magnetic element, which can be used to cancel out homogeneous disturbance fields, is configured to apply a bias magnetic field to the at least two sensors. In embodiments, the sensor system can further comprise at least one field detection sensor configured to detect a strength of the bias magnetic field. In embodiments, the sensor system can further comprise at least temperature sensor configured to measure the temperature of the magnetic element. For example, in one embodiment an output signal related to each of the at least two sensors representative of the magnetic field angle can be used to infer the current in the conductor by computing an average of measured angle deviation from the bias fields.

In embodiments, the sensors can comprise Hall effect sensors (e.g., ordinary Hall plates or vertical Hall effect sensors) or magnetoresistive (MR) sensors or sensor elements, such as magnetoresistive (MR) sensors, such as giant magnetoresistors (GMRs), tunneling-magneto resistors (TMRs), colossal magnetoresistors (CMRs) and anisotropic magnetoresistors (AMRs), among others. MR sensors can be either weak-field MRs or strong-field MRs. In general, all types of MRs respond to the projection of magnetic fields into a sensitivity plane, which is parallel to the flat shape of the MRs. The MR thickness is much smaller than the lateral dimensions, and so the lateral dimensions define the sensitivity plane, which generally is the same as the main surface of a substrate onto which the MRs are sputtered or otherwise arranged and that will be referred to herein as the x,y plane.

MRs with pinned layers (e.g. GMRs, TMRs, CMRs) have a minor loop behavior and a major loop behavior. The minor loop is for smaller applied magnetic fields (i.e., where the device is usually operated), whereas the major loop is for stronger fields that can represent excessive stress to the MRs. In the minor loop, the reference magnetic system of the MRs (i.e., the pinned layer(s)) remains predominantly constant, whereas in the major loop the magnetization can be altered significantly (i.e., turned out of the intended reference direction or even de-magnetized).

In the minor loop, weak-field MRs respond mainly to the magnetic field component in a sensitivity direction (e.g., Bx, or the x-direction component of a magnetic field B), but this behavior also can be modulated by the magnitude of the magnetic field component orthogonal to the sensitive direction ($|B_y|$). A typical dependence of the resistance is given by:

$$R = \frac{R_{max} + R_{min}}{2}\left\{1 + \frac{R_{max} - R_{min}}{R_{max} + R_{min}}\tanh\left(\frac{B_x}{a + b|B_y|}\right)\right\},$$

or more generally:

$$R = R_0\left\{1 - f\left(\frac{B_x}{a + b|B_y|}\right)\right\},$$

where f(x) is an odd function of x (meaning f(x)=−f(−x)) and the real numbers a and b are greater than zero.

In other words:
i. The resistance at zero magnetic field in sensitivity direction $B_x=0$ is $(R_{max}+R_{min})/2$, independent of $B_y$.
ii. A magnetic field in the y-direction, of arbitrary polarity, has the same effect as a reduction of the magnitude of $B_x$.
iii. If $B_x$ assumes very large positive values, the resistance tends toward $R_{max}$. In practice, however, the field will eventually be so large that the minor loop no longer applies, and the sensor will enter the major loop, where the MR effect breaks down more or less suddenly.
iv. If $B_x$ assumes very large negative values, the resistance tends toward $R_{min}$. Again here the sensor eventually exits the minor loop and enters the major loop region.
v. The number a describes the tendency of the free layer of the MR sensor to align along the y-direction due to effects like, e.g., shape-anisotropy. The term $b|B_y|$ means that any field in the y-direction increases this tendency.

In the minor loop region, strong-field MRs respond to the angle φ between the applied in-plane magnetic field and a reference direction that is also parallel to the sensitivity plane; however, they do not respond to a change in magnitude of the field. A typical dependence of the resistance is given by:

$$R = \frac{R_{max} + R_{min}}{2}\left\{1 + \frac{R_{max} - R_{min}}{R_{max} + R_{min}}\cos\varphi\right\}.$$

This formula is valid in wide ranges of in-plane field magnitudes (e.g., between about 10 milli-Teslas, mT, and 200 mT).
i. For stronger fields, the sensor exits its minor loop and enters the major loop region.
ii. Strong-field MRs typically have only negligible or vanishing shape-anisotropy, which means that the magnetization of the free layer has no tendency to align to any direction. Therefore it is pulled into the direction of the applied field.
iii. For very small applied fields, the strength of the applied field is too weak to pull the magnetization in the direction of the field. A reason for this can be impurity centers that trap the magnetization. So, the magnetization eventually lags behind the applied field direction, if the applied field rotates. Then the above equation is inaccurate or completely fails.

In embodiments comprising MRs, the MRs can be strong-field MRs or weak-field MRs.

Figure 2:
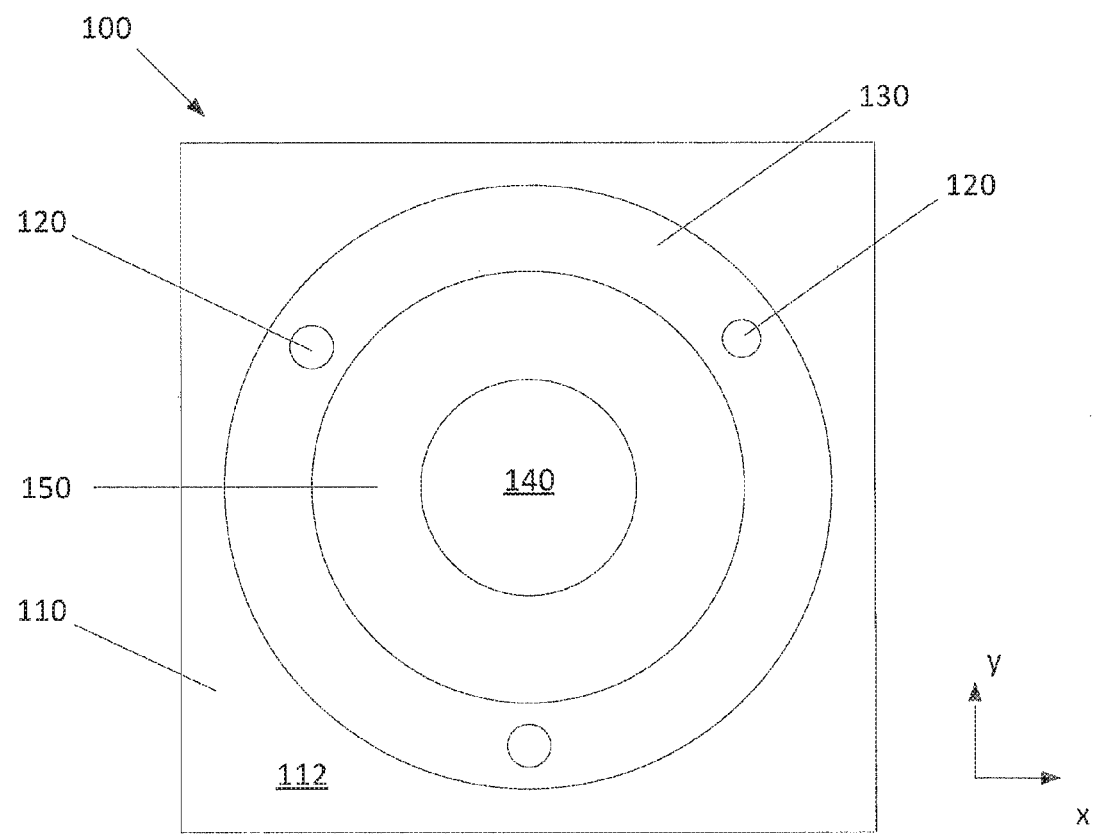
FIG. 2 is a top view of the sensor system and conductor of FIG. 1.
Figure 3:
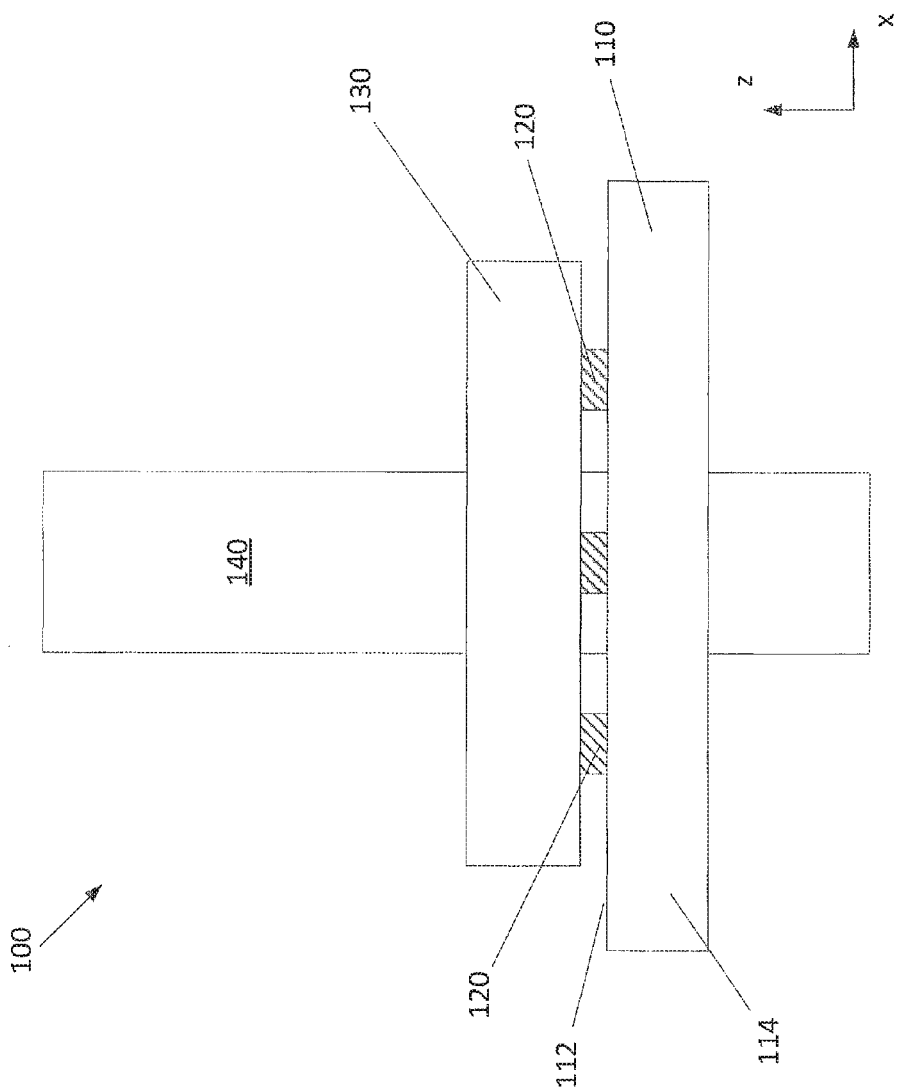
FIG. 3 is a side view of the sensor system and conductor of FIG. 1.

Referring to FIGS. 1-3, a sensor system 100 according to an embodiment is depicted. Sensor system 100 comprises a support structure 110, at least two sensors 120 arranged on a surface of support structure 110, and a magnetic element 130 coupled to or arranged proximate sensors 120. Sensor system 100 can be arranged proximate a conductor 140, configured to carry current to be sensed by sensing a magnetic field induced thereby. In embodiments, sensor system 100 is used or operated in conjunction with conductor 140, but conductor 140 itself does not comprise a part of system 100 unless otherwise discussed or described with respect to particular embodiments.

Support structure 110 can comprise a printed circuit board (PCB), a component board, a substrate, a leadframe, a die (e.g., as illustrated in the example of FIG. 1), or some other suitable structure or device. For example, the particular composition and arrangement of support structure 110 can be customized or designed for a specific application requirement. In embodiments, support structure 110 can comprise at least one aperture 150 in or through which conductor 140 is arranged. Aperture 150 can be centrally located in support structure 110, such as the generally circular aperture 150 of FIGS. 1-3, or aperture 150 can be arranged off-center or extend inwardly from an edge of support structure 110 (see, e.g., FIG. 4), or can have some other suitable arrangement or configurations in other embodiments. In embodiments, aperture 150 can be round, square or generally symmetric, or aperture 150 can comprise some other shape, such as keyhole, oval, or oblong, among others.

The size of support structure 110, as well as aperture 150, can vary in embodiments, such as may be necessary to accommodate a particular conductor, for a particular application, or some other factor. In the embodiment of FIGS. 1-3, support structure 110 is generally square or rectangular, and its dimensions can be on the order of about 20 millimeters (mm) by about 20 mm by about 1.5 mm, but this is merely one example, and support structure 110 can be narrower, wider, longer, shorter, thicker, thinner, or differently shaped in other embodiments, as can be aperture 150. In embodiments, aperture 150 can be sized to accommodate conductor 140 such that the diameter of aperture 150 is sized generally larger (e.g., about 13 mm) than the diameter of conductor 140 (e.g., about 10 mm). For example, in embodiments it can be advantageous to centrally arrange conductor 140 within aperture 150, whereby a centering device such as a non-conductive and non-magnetic sleeve (not depicted) can be used to form an isolation barrier around conductor 140 to secure central placement of conductor 140.

In sensor system 100, a major plane of support structure 110, i.e., the xy-planar surface 112 facing upwardly in the orientation of FIG. 2, is arranged perpendicular with respect to a length of conductor 140 (e.g., perpendicular to a primary current flow direction in conductor 140, or parallel with a diametric cross-section of conductor 140). Sensors 120 are arranged on surface 112 in embodiments, and each sensor 120 itself can comprise a die and at least two magnetic field sensor elements coupled to or arranged on the die (not visible in FIGS. 1-3). Though referred to herein generally as a die, the term "die" is not limiting with respect to all embodiments and/or the scope of the claims. In various embodiments, a die can comprise a substrate, a die, a component board, circuit board a combination thereof or some other support structure capable of establishing and/or maintaining relative placement of the magnetic sensor elements with respect to each other and/or at least one other component. For example, in other embodiments sensors 120 also can comprise a sensor package or other configurations specific to an application or system requirement. In embodiments, support structure 110 can further comprise circuitry such as application specific integrated circuits (ASICs), microprocessors, and/or other circuitry to receive and process output signals associated with sensors 120. In other embodiments, this circuitry can be otherwise coupled to system 100 or located in or on a component other than support structure 110.

In embodiments, each sensor 120 comprises at least two sensor elements, which can comprise Hall effect sensor elements (e.g., ordinary Hall plates or vertical Hall effect sensor elements) or MR sensor elements (e.g., TMRs, GMRs, CMRs, AMRs and others) and/or other type(s) of magnetic field sensor elements or combinations thereof configured and/or arranged to detect at least one magnetic field component of a magnetic field induced by current flow in conductor 140. In embodiments, the sensor elements of sensor 120 are sensitive to a magnetic field component that is parallel to the xy-planar surface 112 of support structure 110, though this can vary in other embodiments. Sensors 120 comprising MR sensor elements each can be configured with sensitivity planes that are parallel to one another. Additionally, it can be advantageous to also configure sensors 120 such that the sensitivity planes are parallel to surface 112 of support structure 110 (i.e., the plane on or in which sensors 120 are positioned).

System 100 as depicted in FIGS. 1-3 comprises three sensors 120 arranged on support structure 110, but in other embodiments system 100 can comprise more or fewer sensors 120. For example, system 100 can comprise as few as two sensors or as many as six or more sensors in other embodiments, some of which will be discussed herein in more detail. In system 100, each sensor 120 can be equidistantly angularly spaced at azimuthal spacings of 360°/N (e.g., 0 degrees, 120 degrees, and 240 degrees for N=3 as in FIGS. 1-3) along a curve concentric to a longitudinal axis of conductor 140, wherein N is an integer that represents the total number of sensors arranged on support structure 110. For example, if N=4, sensors 120 can be arranged at 0 degrees, 90 degrees, 180 degrees and 270 degrees. In still other embodiments, sensors 120 are not equidistantly angularly spaced and/or are not arranged along a curve concentric to a longitudinal axis of conductor 140, in some other suitable configuration, though some other arrangements can be less advantageous than others even if providing certain advantages in some embodiments or applications. Generally, sensors 120 can be sized on the order of about 1 mm by about 1 mm by about 0.2 mm, but this is merely one example, and those skilled in the art will appreciate that the size and configuration of sensors 120 and/or any related package or other components can vary generally without altering the underlying sensing principles discussed herein unless otherwise mentioned. Additionally, and as previously mentioned, sensors 120 can be strong-field or weak-field magnetic sensors.

In embodiments, magnetic element 130 comprises a magnet, such as a permanent magnet, though in other embodiments magnetic element 130 can comprise, e.g., a magnetic paste or any other suitable magnetic component or device. Though its material can vary, magnetic element 130 can comprise a hard ferrite with a remanence of about 220 mT in one embodiment. Magnetic element 130 is generally circular and donut-shaped in embodiments and can have an inner diameter of about 14 mm, an outer diameter of about 18 mm and a thickness or depth of about 2.5 mm in one example embodiment, but as for or with other components of system 100 these dimensions can vary in other embodiments. Magnetic element 130 typically has a relative permeability between about 0.9 and about 2, which means it does not significantly change the field of the current flowing through the conductor but only adds an additional bias field on sensor elements 120. In particular, magnetic element 130 does not work as a flux guiding structure or as a flux concentrator.

Magnetic element 130 can be arranged relative to support structure 110 and sensors 120, such as above both as depicted in FIGS. 1-3, though the relative arrangement of elements of system 100 can vary in other embodiments, with sensors 120 and/or magnetic element 130 arranged below support structure or in some other configuration. Some adaptations or modifications can be necessary in embodiments, such as an interface or coupling arrangement between magnetic element 130 and support structure 110 being increased to provide a more secure attachment of magnetic element 130 to support structure 110 in embodiments in which magnetic element 130 is below support structure and therefore more susceptible to separate due to the effects of gravity or other forces. In a configuration in which sensors 120 remain on surface 112 but magnetic element 130 is arranged below support structure 110, however, eddy currents induced in magnetic element 130 can have a reduced effect on the output signals of sensors 120 because of the increased distance between sensors 120 and magnet 132. The relative position and placement of magnetic element 130 can vary in embodiments, as can the relative arrangement and orientations of sensors 120. For example, in other embodiments, magnetic element 130 can vary in geometrical shape, can be individually coupled to each sensor 120 (an embodiment discussed in more detail below) or can be arranged above or below support structure 110. Moreover, system 100 in FIGS. 1-3 (and generally in the other figures here) may not be to scale and are simplified conceptual depictions to illustrate basic components and features of an embodiment of sensor system 100.

Magnetic element 130 can be radially magnetized in a direction toward or away from a center of support structure 110 and can be arranged along a curve concentric to conductor 140 (e.g., generally centered around conductor 140). In other embodiments, magnetic element 130 can be magnetized in parts (i.e., not magnetized in its entire volume) or comprise some other type of magnet. In any case, magnetic element 130 can be configured to induce a bias magnetic field in a direction perpendicular to the direction of a magnetic field induced by a flow of current in conductor 140, but may vary in embodiments as discussed herein.

As depicted, conductor 140 comprises a cable, wire or rod having a generally circular cross section, though those skilled in the art will recognize that it can be desirable and is possible to detect magnetic fields in a variety of different types of conductors, which also can be suitable for use with embodiments of system 100. For example, conductor 140 can comprise a busbar, threaded screw, dedicated stud, a hollow cylinder or some other device or structure in other embodiments. It can be advantageous if conductor 140 comprises a generally circular cross-section because in such a configuration the current-induced magnetic field is independent of the frequency. For example, in an embodiment where the cross section of conductor 140 does not comprise a generally circular structure (refer, e.g., to FIGS. 11A-B) or if a plurality of conductors 140 are used, eddy currents can lead to errors in the output readings of sensors 120 at high frequencies. In general, and as previously mentioned, conductor 140 itself generally does not comprise part of system 100, and it is envisioned that system 100 can be configured for use with virtually any conductor configuration, placement and application. The examples given herein are merely those that may be common or are used for convenience to illustrate the basic features, components and operation of system 100.

In FIG. 3, the relative arrangement of magnet 132, sensors 120 and support structure 110 are shown in a side cross-sectional view. The coupling of sensors 120 to support structure 110 can be performed utilizing various assembly techniques such as flip-chip as depicted in FIG. 3 or other suitable assembly techniques in embodiments. In a flip-chip configuration, an electrical connection is established between sensors 120 and support structure 110 via solder or other bumps, balls or underfill of each sensor 120 and a conductive layer (e.g., conductive traces) formed in or on the surface 112 or 114 of support structure 110 on which sensors 120 are mounted. In other embodiments, the various components depicted (e.g., sensors 120 and magnetic element 130) as well as others of or in system 100 can be conventionally mounted to support structure 110 (i.e., with their back or rear sides coupled to a surface or element of support structure 110), and electrical connections can be made between sensors 120 and traces on support structure 110 by wire bonding, such as nail bonding or wedge bonding (refer, e.g, to FIG. 7). Regardless of the particular configuration or technique used to mount or couple sensors 120, magnetic element 130, or other components to or with support structure 110, the various components can further comprise a covering such as a protective mold compound (not depicted) or other material or structure to protect against environmental and/or other damage. Thus, sensor elements 120 in FIG. 3 can also be surface mounted devices (SMDs) comprising sensor elements, either leadless (i.e., contacts are made via pads or lands on the bottom of the package body) or with gull wings or leads, either on two opposing edges of a package or on all four edges around the perimeter of the package, or on the entire bottom surface of the package, or in some other suitable configuration.

In other embodiments, support structure 110 can further comprise grooves or mounting posts such that sensors 120 can be mounted within the grooves or on the mounting posts. Magnetic element 130 then can be coupled directly to support structure 110 above sensors 120, or to the mounting posts to avoid attachment of magnetic element 130 to sensors 120.

Figure 4:
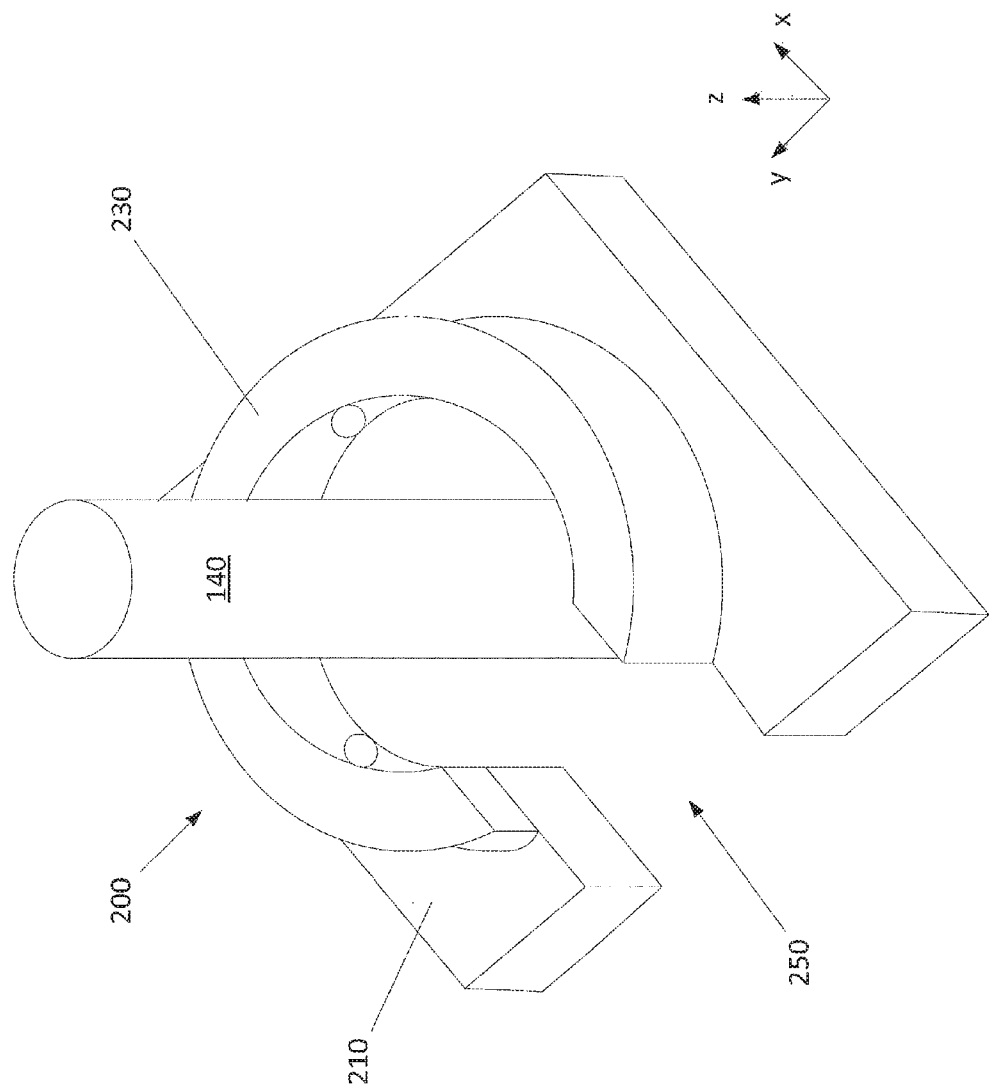
FIG. 4 is a perspective view of a sensor system and a conductor according to an embodiment.

Another embodiment of a sensor system 200 is depicted in FIG. 4. Similar to sensor system 100, sensor system 200 can comprise a support structure 210, at least two sensors (not visible in FIG. 4 but similar to arrangement and composition to sensors 120 unless otherwise mentioned) coupled to support structure 210, a magnetic element 230 coupled to or arranged above the sensors. Herein throughout, similar reference numerals will be used to refer to similar elements or features (e.g., support structure 110 and support structure 210), though differences between similar elements may still be present as depicted and discussed. Like system 100, system 200 is arranged proximate conductor 140. Support structure 210 comprises at least one aperture 250, which in FIG. 4 extends inwardly from an edge of support structure 210 in a generally keyhole configuration. Similarly, magnetic element 130 can comprise an open-loop configuration (e.g., a C-shape, semi-circular shape, or some other configuration comprising an opening or gap) to more easily facilitate insertion of conductor 140 into aperture 150 (or, conversely, arrangement of system 200 around conductor 140) for installation and/or repair or replacement (e.g., if defects exist).

The asymmetry of magnetic element 130 in system 200 can lead to a distortion of the bias magnetic field induced by magnetic element 130 in which the direction of magnetization changes (e.g., the field will no longer point in a consistently radial direction) and the strength of the field sensed by each sensor 120 can vary significantly depending upon its position relative to the opening in magnetic element 130. This can result in increased complexity of system 100 and in an algorithm used to estimate the sensed current (refer, e.g., to FIG. 8), as well as a reduction in the accuracy and robustness of system 100 against errors (e.g., background interference and position or shape tolerances of conductor 140). Contrarily, the open-loop configuration of magnetic element 130 can be advantageous in that it can increase the bandwidth of system 200. In embodiments, the bandwidth can be greater than about 100 kHz, such as about 1 MHz or more in embodiments, by preventing a shorted ring topology of magnetic element 130 in which excessive eddy currents (i.e., currents induced in conductor 140 by the changing magnetic field) could flow at large sudden changes of current (e.g., if magnetic element 130 comprises a conductive material, such as bulk material with non-vanishing conductivity or conductive coating).

Figure 5:
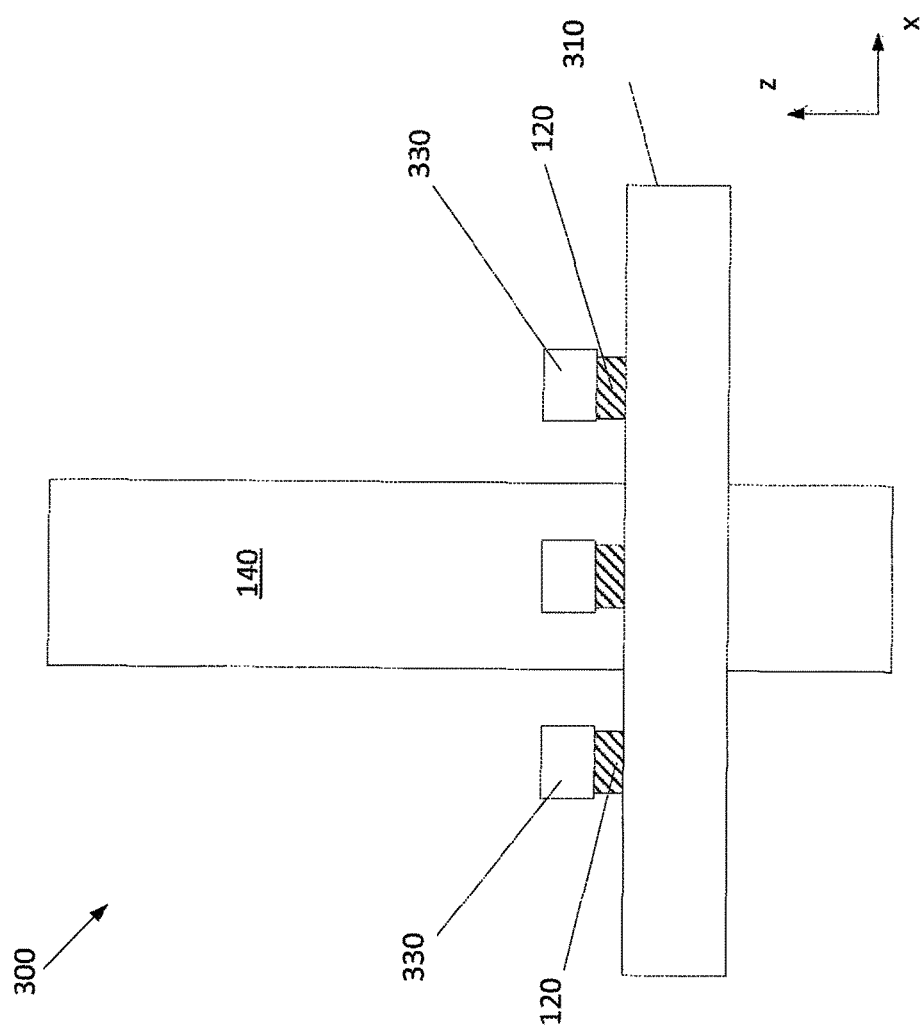
FIG. 5 is a side view of a sensor system and a conductor according to an embodiment.
Figure 6:
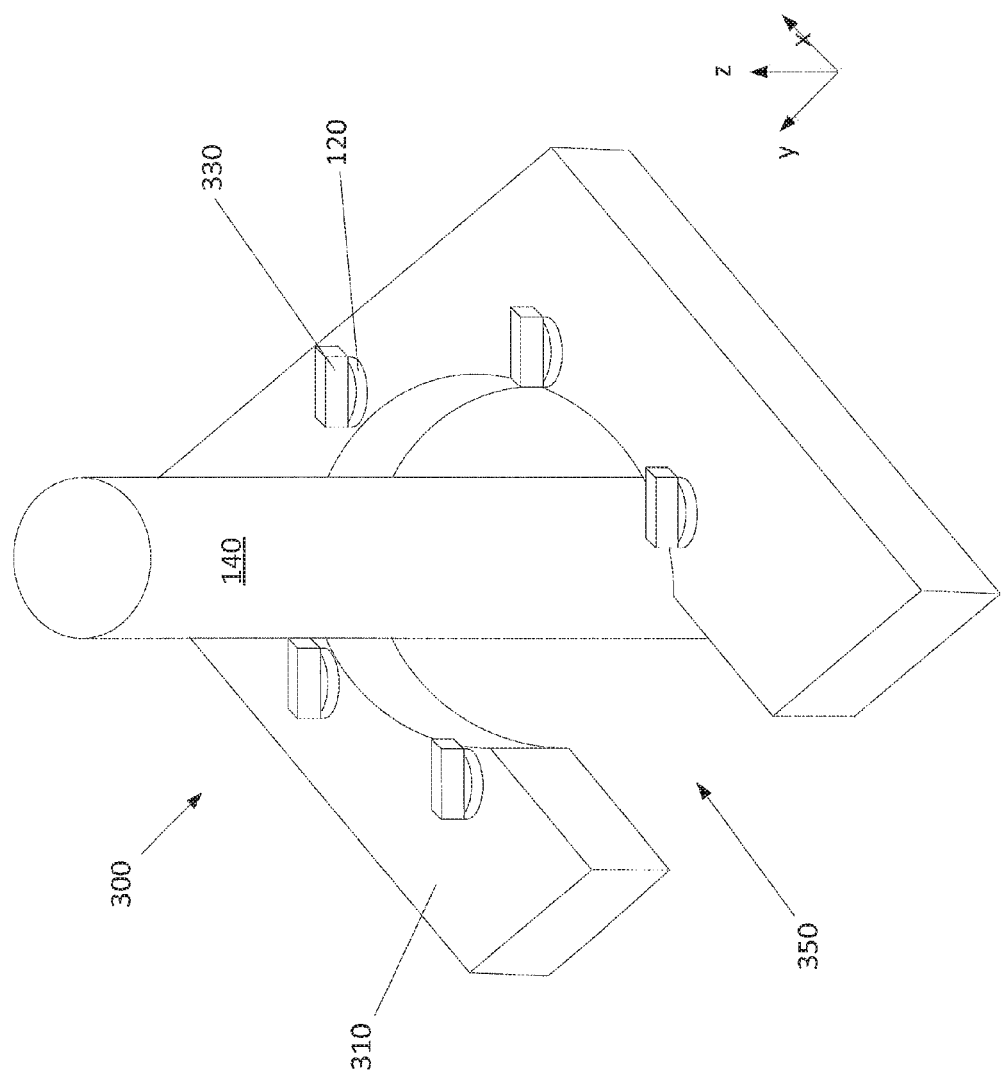
FIG. 6 is a perspective view of a sensor system and a conductor according to an embodiment.
Figure 7:
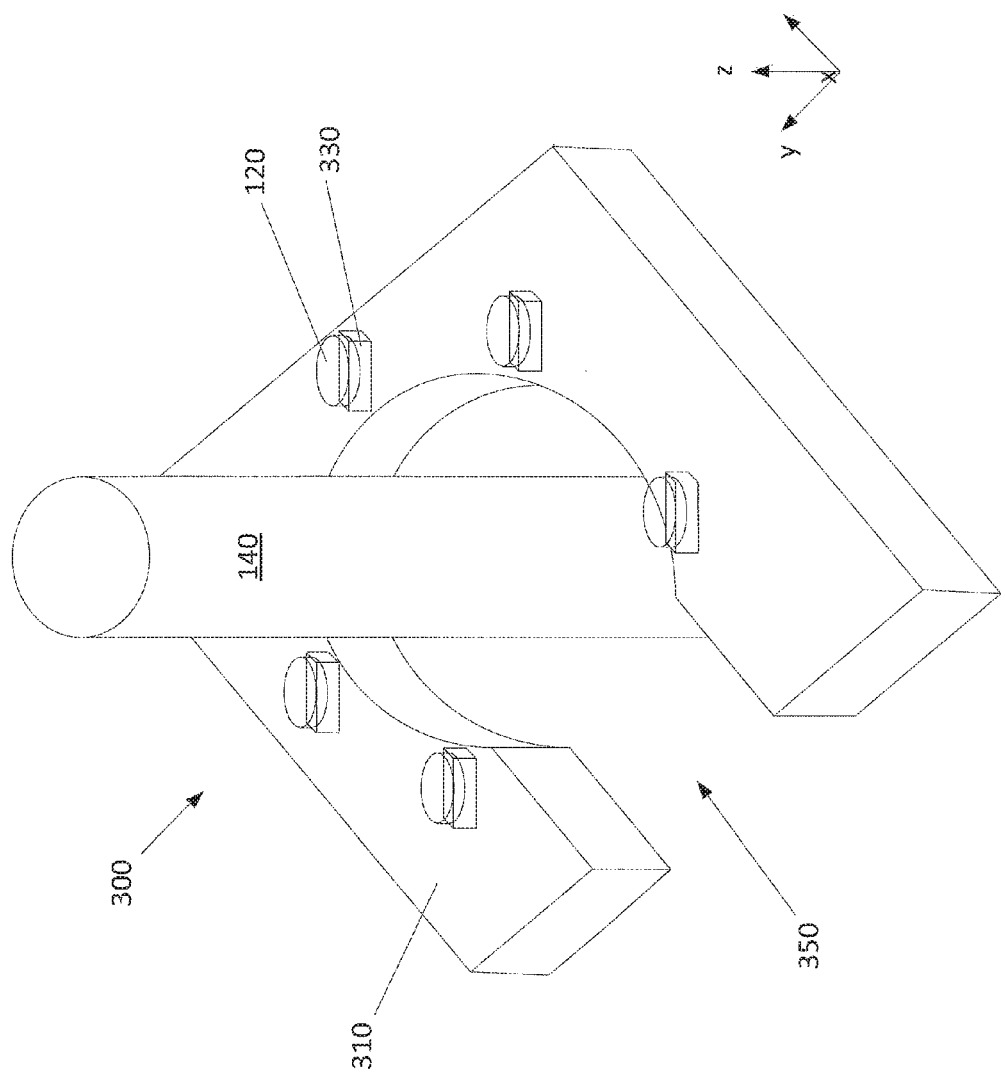
FIG. 7 is a perspective view of a sensor system and a conductor according to an embodiment.

Another embodiment of a sensor system 300 is depicted in FIGS. 5-7. Sensor system 300 can comprise at least five sensors 120 arranged along a curve concentric to conductor 140 at azimuthal spacings of 72 degrees (i.e., 360 degrees/N, with N=5). For large N, the total number of conductive traces on support structure 310 can also increase; therefore it can be advantageous to arrange sensors 120 in such a way that support structure 310 can be configured as a single-layer PCB or other device. The use of an odd number (e.g., three, five, seven, etc.) of sensors 120 can be advantageous for achieving higher system accuracy at lower system costs.

In system 300, the magnetic element (e.g., magnetic element 130 of system 100) can comprise a plurality of individual magnetic elements 330 each associated with an individual sensor 120. In one embodiment, a magnetic element 330 can be coupled to its associated sensor 120 by adhesive bonding or some other suitable technique. Each magnetic element 330 can comprise a generally block shape in embodiments, though in other embodiments magnetic elements 330 can be cylindrical or have some other multi-sided configuration. Magnetic elements 330 can be sized larger or smaller than sensors 120, depending on the remanence of the permanent magnetic material used. For inexpensive, weak ferrites, elements 330 generally are larger in each dimension as depicted in FIGS. 5 and 6. Magnetic elements 330 also can be part of a sensor package (e.g., parts of the leadframe, the die-attach adhesive, and/or the mold compound can be permanent magnetic or a permanent magnet can be attached to a sensor die or to a leadframe portion and covered by mold compound). In one embodiment, sensors 120 can be flip-chip mounted to support structure 310 such that each magnetic element 330 can be coupled to a non-conductive surface of sensors 120 (i.e., the upward-facing surface in FIG. 5). In other embodiments, magnetic elements 330 can be coupled to support structure 310, with sensors 120 then arranged on magnetic elements 330, as is depicted in the embodiment of FIG. 7. In such a configuration, sensors 120 can be coupled to magnetic elements 330, with the electrical connection between sensors 120 and support structure 310 established using wire bonding or other suitable methods. If sensor elements 120 comprise sensor packages, their leads can be bent and formed to make contact to conductive traces on the support structure 310. The size of the bond loops or leads (not shown in FIG. 7) can be dependent on the thickness (z-direction) of magnetic elements 330 and sensors 120, with loop size minimized in embodiments by utilizing sensors 120 with thin sensor dies or a thin magnetic element 330 with high remanence). In other embodiments, it can also be advantageous to couple magnetic elements 330 within grooves formed in support structure 310 (refer, e.g., to the discussion related to FIG. 3) to reduce the difference in z-coordinates between sensors 120 and the conductive layer formed on support structure 310.

Utilizing dedicated magnetic elements 330 (i.e., individual magnetic elements coupled to sensors 120 as in FIGS. 5 and 6), the total magnetic mass of system 300 decreases, which in turn leads to a reduction in cost and in the mechanical stress on sensors 120. Additionally, costs can also be reduced by the use of different manufacturing techniques, such as pre-assembling magnetic elements 330 and sensors 120 separately from support structure 110. For example, the assembly of each magnetic element 330 to a respective sensor 120 to form a sensor/magnet unit can be completed at one manufacturing facility, with the mounting of the sensor/magnet units to support structure 330 taking place at a second manufacturing or assembly facility. The assembly of magnetic elements 330 and sensors 120 can be done on single dies and magnets, yet it may also be done more cost efficiently by mounting a complete substrate comprising many sensor dies onto a large magnet (e.g., as large as the substrate) and singulating both simultaneously in a generalized substrate cutting process. As such, it can be advantageous to arrange magnetic elements 330 in apposition (i.e., at least approximately flush) with sensors 120. In this arrangement, it also can be possible to couple magnetic elements 330 to a front side of sensors 120, which can comprise bond pads for electrically coupling sensors 120 to support structure 310. For example, if magnetic elements 330 are attached to a top or front side of sensors 120, then grooves can be etched into a surface of each magnetic element 330 prior to assembly. Thus, the bond pads become accessible from the grooves etched in the surface of magnetic elements 330 while the rear or bottom sides of magnetic elements 330 remains free of attachments.

In other embodiments and consistent with those discussed above, magnetic elements 330 can comprise a magnetic paste applied to a top or bottom of a die or other portion of sensors 120. To establish the desired magnetic properties and to increase the adhesive strength of the magnetic paste upon application to sensors 120, the magnetic paste can be subjected to a curing process at relatively low temperatures (e.g., less than about 500° C.) to become sintered. To limit the thermal load during the curing process, magnetic pastes comprising particles sized below about 1 µm (i.e., nanoparticles) can be advantageous in embodiments (because, e.g., their large surface increases reactivity and thus minimizes curing temperature). Other magnetic elements and processes for utilizing them within system 300 or other systems discussed herein can be used in various embodiments.

Regardless of the type of magnetic element 330 used, magnetic element 330 (or 130 or 230 or others depicted and/or discussed herein) can be coupled to sensors 120 in a magnetized or un-magnetized form to facilitate handling. For example, the magnetization of magnetic element 130 can occur following a curing process and coupling of magnetic element 130 to sensors 120. The same can be true for the plurality of magnetic elements 330 of system 300. In addition, if sensors 120 comprise sensor elements that also require magnetization (e.g., GMRs or TMRs), the sensor elements 120 can be magnetized before or after the magnetization of magnetic element 130 to avoid performance degradation of magnetic element 130 or sensors 120. Other techniques to avoid degradation can include, for example, magnetizing magnetic element 130 and sensor elements of sensors 120 in a single simultaneous process, such as magnetizing by applying a strong field on the order of about 1 T and curing the sensor elements in a single step. Additionally, if system 100 is assembled conventionally (i.e., sensors 120 coupled to support structure 110 and magnetic element 130 coupled to sensors 120), a device can be used to secure placement of magnetic element 130 until the adhesive element applied to magnetic element 130 hardens. Such device can comprise, e.g., a generally circular or ring shape with ferrous parts that secure placement of magnetic element 130 via the magnetic attraction formed between the ferrous parts and magnetic element 130. The device can also comprise a permanent magnet to secure placement of magnetic element 130 during assembly, whereby the permanent magnets have a well-defined polarity unlike the ferrous parts, which attract both north and south poles that can lead to errors in the polarity of some magnets.

Figure 8:
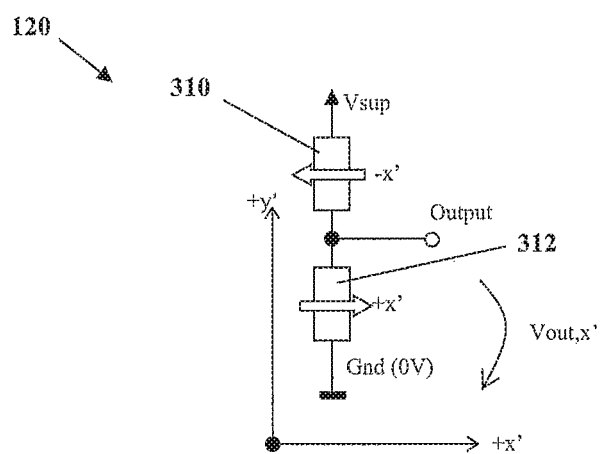
FIG. 8 is a diagram of a half-bridge circuit of magnetoresistors according to an embodiment.

Referring to FIG. 8, in embodiments each sensor 120 can comprise at least two magnetoresistors (MRs) 310, 312 arranged in a half-bridge configuration. MRs 310, 312 can comprise GMRs, TMRs or other suitable magnetoresistors, which can be strong-field or weak-field, and can comprise a stack of multiple layers of materials such as Pt, Mn, Ru, Cu, and others. MRs 310, 312 can be electrically coupled in series between a supply voltage (Vsup) and a reference voltage (Gnd) in a half-bridge configuration in which MR 312 at a lower potential has a reference direction +x' and MR 310 at a higher potential has reference direction −x' (e.g., opposite and parallel reference directions). The local reference frame (x',y') is attached to sensor element 120. Conversely, the location of the half-bridge will be referred to herein as position (R, ψ), which are radial distance and azimuthal position in a global cylindrical reference frame centered in the middle of conductor 140. The global cylindrical coordinate system (R, ψ) can also be expressed in terms of the global Cartesian system (x,y) via $R^2=x^2+y^2$ and $\tan(\psi)=y/x$. Therefore, the global Cartesian system is shown in all figures that show the complete sensor arrangement, whereas the local reference frame (x',y') is shown in FIG. 8, which shows a single sensor element 120.

MRs 310, 312 can comprise strong-field MRs configured to detect the signals:

$$\frac{B_y(R,\psi)}{\sqrt{B_x^2(R,\psi)+B_y^2(R,\psi)}}\cos\psi - \frac{B_x(R,\psi)}{\sqrt{B_x^2(R,\psi)+B_y^2(R,\psi)}}\sin\psi.$$

If MRs 310, 312 comprise GMRs or TMRs, the output voltage of the half bridge is:

$$V_{out,x'} = \frac{V_{supply}}{2}\left(1 + h\frac{B_{x'}}{\sqrt{B_{x'}^2+B_{y'}^2}}\right)$$

with h=0.05 for GMRs and 0.5 for TMRs, and whereby x' and y' represent the sensitivity plane of sensor 120.

Figure 9:
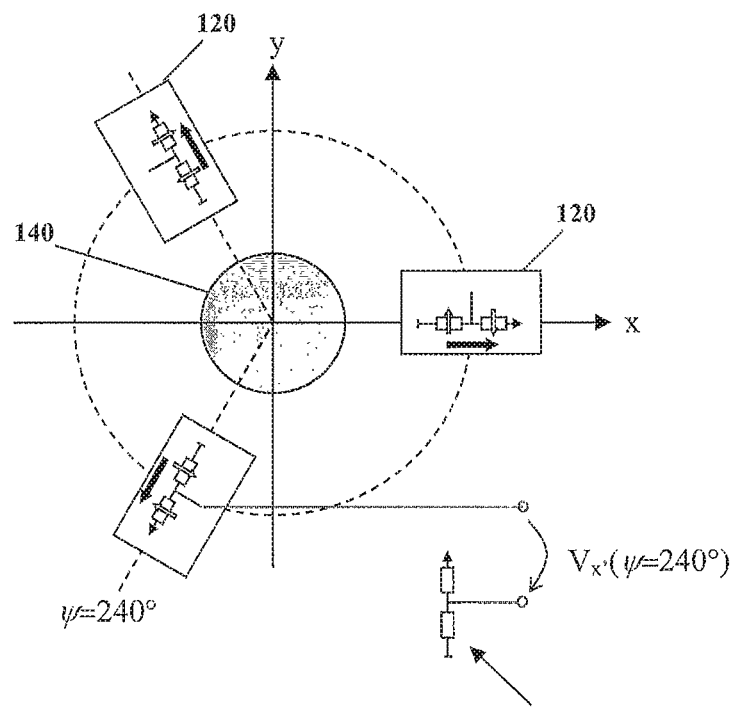
FIG. 9 is a top view of a sensor system and a conductor according to an embodiment.

The half-bridge circuit of FIG. 8 can be configured as an angle sensor as depicted in FIG. 9, which comprises three sensors 120 arranged at integer multiples of 120 degrees around conductor 140. Each sensor 120 comprises a half-bridge of sensor elements 310, 312 as depicted in FIG. 8.

The reference direction of each MR element is shown by the white arrows thereupon, and the direction of the bias magnetic field is shown by the solid black arrows, pointing radially outward on all sensor elements 120. The bias field generation can be part of the MR bridge or not in various embodiments. If it is part of the bridge, a permanent magnetic paste can be applied to the rear or front side of the sensor die and magnetized in the y'-direction of the die (i.e., distinguishing here between the x',y' reference frame fixed to the sensor die and the x,y reference frame fixed to conductor 140). If the bias field is not part of the MR bridge, a permanent magnet can be attached to the sensor die or the complete arrangement after fabrication of the sensor die. Note that the bias field directional arrows in FIG. 9 do not mean that a magnet has to be placed there; rather, it generally means that a magnetic bias field is present there in the indicated direction. This field could come from a ring magnetic element (e.g., as depicted in FIGS. 1-3) or numerous other sources of magnetic field generation. Additionally, the bias field also can be an intrinsic part of the MR stack, with one of the layers producing the bias magnetic field.

The output voltage of a half-bridge circuit can be measured against the output voltage of a reference voltage divider 400 of two simple resistors that do not respond to magnetic fields. The same reference voltage divider 400 can be used for all three sensors 120 such that with $$V_{x'} = V_{out,x'} - \frac{V_{supply}}{2} = \frac{V_{supply}}{2}h\frac{B_{x'}}{\sqrt{B_{x'}^2+B_{y'}^2}},$$

a signal $$S_{x'} = (2V_{x'})/(hV_{supply}) = \frac{B_{x'}}{\sqrt{B_{x'}^2+B_{y'}^2}}$$

can be defined for each sensor 120. Thus, $S_{x'}=S_{x'}(\psi)$ is a function of the azimuthal coordinate ψ of each respective sensor 120 (e.g., 0 degrees, 120 degrees and 240 degrees in FIG. 9). When sensor element 120 is positioned according to FIG. 9, such that its y'-direction is parallel or anti-parallel to the radial direction and its x'-direction is anti-parallel or parallel to the azimuthal direction, it holds that $B_{x'}=\pm(B_y\cos\psi - B_x\sin\psi)$ and that therefore the signal $\pm S_{x'}$ is identical to:

$$\frac{B_y(R,\psi)}{\sqrt{B_x^2(R,\psi)+B_y^2(R,\psi)}}\cos\psi - \frac{B_x(R,\psi)}{\sqrt{B_x^2(R,\psi)+B_y^2(R,\psi)}}\sin\psi$$

Figure 10A:
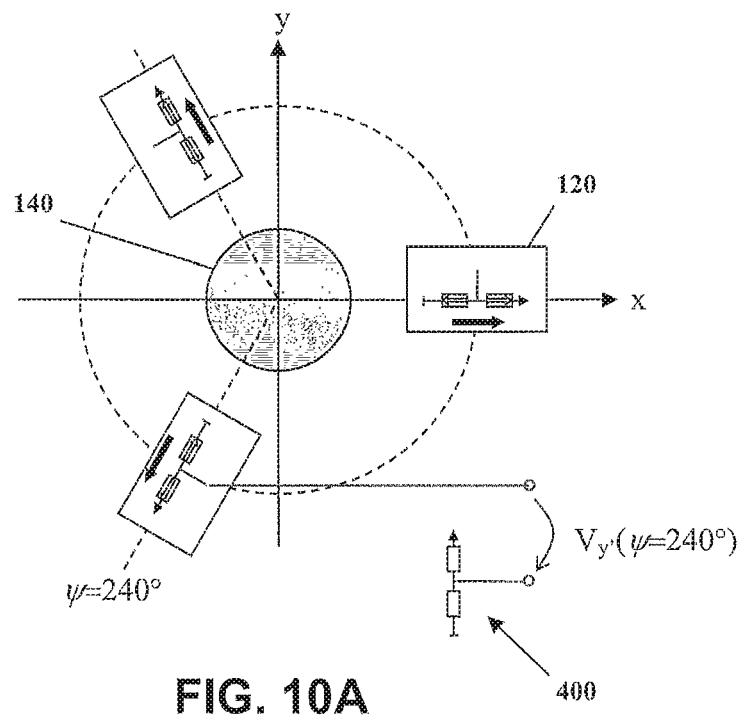
FIG. 10A is a top view of a sensor system and a conductor according to an embodiment.

Similarly, MRs 310, 312 with y' reference directions as depicted in FIG. 10A also can be used. Here, an output voltage (Vy') can be defined by:

$$V_{y'} = V_{out,y'} - \frac{V_{supply}}{2} = \frac{V_{supply}}{2}h\frac{B_{y'}}{\sqrt{B_{x'}^2+B_{y'}^2}}$$

with a corresponding signal $$S_{y'} = (2V_{y'})/(hV_{supply}) = \frac{B_{y'}}{\sqrt{B_{x'}^2 + B_{y'}^2}}$$

defined for each sensor 120.

Another consideration in embodiments is the capacitance of signals wires used to couple the half-bridges. For example, in one embodiment (e.g., similar to as depicted in FIG. 2) aperture 150 can be about 10 mm in diameter, such that signal wires coupling sensors 120 are on the order of one to several centimeters each and have a capacitance of about 50 pF. The output resistance of each half-bridge, in contrast, is on the order of kilo-Ohms (kΩ). Thus, an RC-low pass filter is formed, effectively limiting the bandwidth of the output signals to about 3 MHz. In embodiments desiring or requiring higher bandwidths, amplifier circuitry can be coupled to each half-bridge to buffer the output signals. In such an embodiment, the dies of sensors 120 can comprise semiconductor dies that can include the amplifier circuitry and other circuitry, with MRs 310, 312 sputtered or otherwise formed on the semiconductor dies.

Figure 10B:
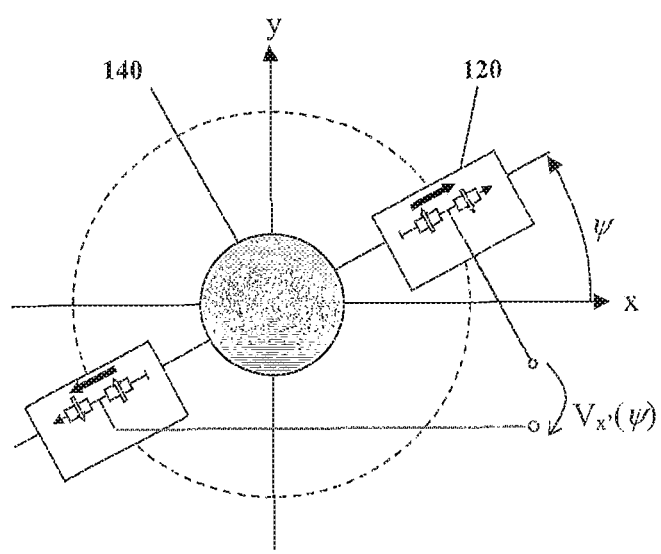
FIG. 10B is a top view of a sensor system and a conductor according to an embodiment.

Still other arrangements and configurations can be implemented in other embodiments. For example, one embodiment can comprise two sensors 120 arranged in a diametrical full-bridge configuration, i.e., opposing each other across conductor 140 with a first sensor 120 at azimuthal position R,ψ and the second sensor 120 at azimuthal position R,ψ+180 degrees. See, e.g., FIG. 10B). One skilled in the art will appreciate that many other configurations and arrangements of various numbers of sensors can be implemented in other embodiments and consistent with one or more principles or concepts discussed herein.

As previously mentioned, conductor 140 generally is not part of system 100, though system 100 operates in cooperation with conductor 140 to the extent it needs a current and/or magnetic field source from which to measure a current and/or magnetic field. In embodiments, therefore, system 100 (or 200, 300, etc.) can be used with virtually any type or configuration of conductor. The generally cylindrical wires depicted as conductor 140 in FIGS. 1-7, 9 and 10 are but one example, and in other embodiments other types and shapes of conductors can be implemented. Some conductor geometries can provide advantages with respect to the positioning of system 100 with respect thereto, position tolerances, magnetic field strength or characteristics, and other characteristics.

Figure 11A:
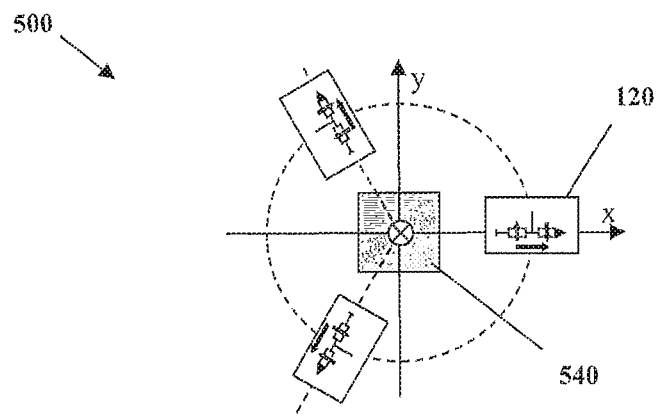
FIG. 11A is a top view of a sensor system and a conductor according to an embodiment.
Figure 11B:
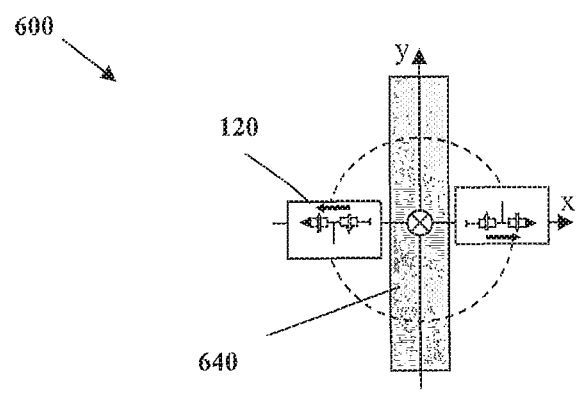
FIG. 11B is a top view of a sensor system and a conductor according to an embodiment.

FIGS. 11A and 11B depict two non-cylindrical conductor geometries. In FIG. 11A, conductor 540 has a square cross-section, while in FIG. 11B conductor 640 has an elongated, rectangular cross-section. The example direction of current flow in conductors 540, 640 is indicated at the x,y axis (i.e., into the drawing page). In system 500 of FIG. 11A, and similar to other systems discussed herein above, the reading circle on which sensors 120 are arranged has a larger radius (or lateral dimension, as in FIG. 11A) than conductor 540. This can help to compensate or otherwise account for position tolerances of conductor 540 in both the x- and y-directions given its geometry.

In system 600 of FIG. 11B, however, sensor elements 120 do not need to face the shorter sides and can instead be arranged opposite the longer sides of conductor 640. Considering possible non-ideal positioning of conductor 640 (i.e., position tolerances), if conductor 640 is arranged off-center in either x-direction, it approaches one of the two sensor elements 120 while moving away from the other one such that the sum of signals remains nearly unchanged by x-position changes. If conductor 640 moves in either y-direction, however, the magnetic field on each sensor element 120 does not change significantly along the longer sides of conductor 640 as long as sensor elements 120 are at least approximately near the centers of the long edges, as in FIG. 11B. Thus, for squat conductor cross-sections (e.g., square, round, etc.), at least three sensor elements 120 can be arranged equidistantly on a reading circle concentric to the center of the conductor (see, e.g., FIG. 11A). For elongated conductor cross-sections, in contrast, it can be sufficient to use only two sensor elements (though more can be used in embodiments) with the sensor elements arranged approximately midway along the longer edges of the conductor (e.g., as in FIG. 11B). In this case it is also possible to find a hypothetical circle on which the sensor elements are located and which is concentric to the center of the conductor, as illustrated in FIG. 11B. In both cases the direction of the bias field between two adjacent sensors differs by 360 degrees/N, where N is the number of sensor elements on the circle (e.g., N=2 in FIG. 11B and the bias field direction indicated by the solid black arrows is anti-parallel, 180° different on both sensor elements).

Figure 12A:
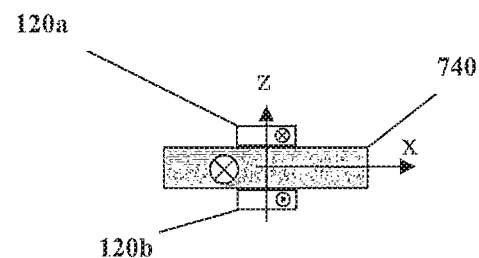
FIG. 12A is a side view of a sensor and conductor arrangement according to an embodiment.
Figure 12B:
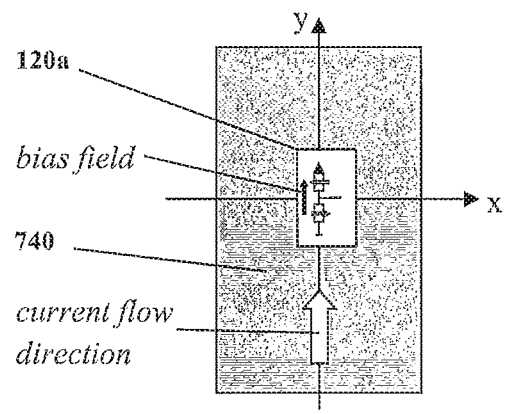
FIG. 12B is a top view of the arrangement of FIG. 12A.
Figure 12C:
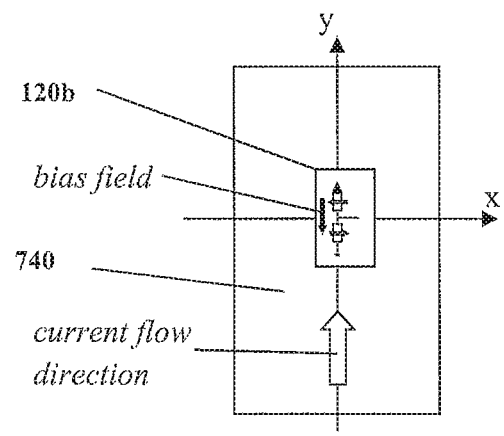
FIG. 12C is a top transparent view of part of the arrangement of FIG. 12A.

While embodiments discussed herein thus far have depicted the direction of the bias magnetic field being generally perpendicular to the direction of the current flow in the conductor, in embodiments the direction of the bias magnetic field can be otherwise aligned, such as parallel to the direction of current flow. An advantage of a parallel arrangement can be that the sensors can be coupled to the conductor. Refer, for example, to FIGS. 12A-C, in which sensors 120a, 120b are coupled to or with conductor 740. The direction of each bias field is shown on each sensor element (i.e., into the page on sensor element 120a and out of the page for sensor element 120b in FIG. 12A), and the current flow direction is shown on conductor 740 (i.e., into the page in FIG. 12A). Sensors 120a, 120b opposing one another across conductor 740 generally will have opposing bias field directions in embodiments. A top view of the arrangement of FIG. 12A is shown in FIG. 12B, while FIG. 12C is a top transparent view with sensor element 120a removed such that sensor element 120b is visible through transparent conductor 740. Note that for systems with N=2 sensor elements, external disturbance fields may not be sufficiently or entirely cancelled out, such that systems with at least N=3 or more sensor elements 120 spaced around the conductor to cancel out external disturbances with arbitrary direction can be advantageous.

As previously mentioned, embodiments can comprise strong-field or weak-field MRs. A weak-field MR embodiment can comprise MRs arranged in the half-bridge configuration depicted above in FIG. 8, for example. The bridge output is:

$$V_{out,x'} = \frac{V_{supply}}{2}\left(1 + \frac{R_{max} - R_{min}}{R_{max} + R_{min}}\tanh\left[\frac{B_{x'}}{a + b|B_{y'}|}\right]\right)$$

Subtracting half of the supply voltage and normalization gives the signal:

$$S_{x'} = \tanh\left[\frac{B_{x'}}{a + b|B_{y'}|}\right]$$

Figure 13:
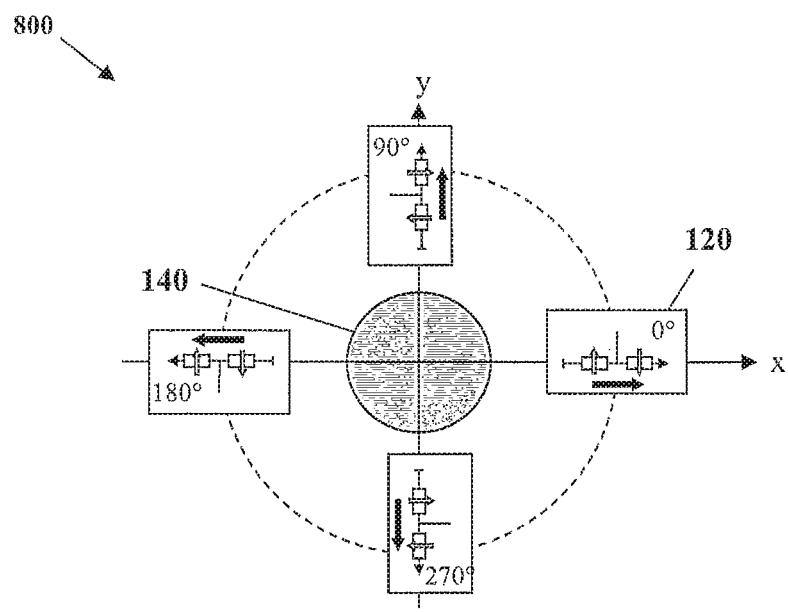
FIG. 13 is a top view of a sensor system and a conductor according to an embodiment.

A sensor system 800 of weak-field MR half-bridges can be arranged as in FIG. 13, in which N=4. While weak-field MRs are discussed with respect to FIG. 13, strong-field MRs can also be used, just as in any other figure or embodiments either can be used unless explicitly mentioned otherwise. The reference direction and bias field arrow notations are the same as those used elsewhere herein. Sensors 120 are arranged equidistantly spaced along a reading circle concentric to conductor 140, e.g., at 0, 90, 180 and 270 degrees. The bias magnetic field of sensor 120 has a y' reference direction, whereas the current-induced magnetic field has a x' reference direction. Thus, a homogeneous disturbance field $\vec{B}_d = B_d(\cos\delta\, \vec{n}_x + \sin\delta\, \vec{n}_y)$ is presumed, which is then transformed into a coordinate system based on the azimuthal position ψ of sensors 810:

Sensor at 0 degrees: $B_{x'} = \frac{\mu_0 I}{2\pi R} + B_d \sin\delta$ and $B_{y'} = B_b + B_d \cos\delta$ Sensor at 90 degrees: $B_{x'} = \frac{\mu_0 I}{2\pi R} - B_d \cos\delta$ and $B_{y'} = B_b + B_d \sin\delta$ Sensor at 180 degrees: $B_{x'} = \frac{\mu_0 I}{2\pi R} - B_d \sin\delta$ and $B_{y'} = B_b - B_d \cos\delta$ Sensor at 270 degrees: $B_{x'} = \frac{\mu_0 I}{2\pi R} + B_d \sin\delta$ and $B_{y'} = B_b - B_d \sin\delta$ The sampled output signal $$S_{x'} = \tanh\left[\frac{B_{x'}}{a + b|B_{y'}|}\right]$$

at each azimuthal position 0 degrees, 90 degrees, 180 degrees, 270 degrees can be determined and summed for all sensors 120, and the result can be expanded into a Taylor series up to second order for small $B_d$ (i.e., disturbance field) to approximate the angle errors. If the bias magnetic field $B_b$ is larger than the disturbance field $B_d$, the current-induced magnetic field component $B_{y'}$ is greater than zero. As such, the average of all four signals becomes:

$$AVG = \frac{S_{x'}(0°) + S_{x'}(90°) + S_{x'}(180°) + S_{x'}(270°)}{4} = \tanh\left[\frac{\mu_0 I}{2\pi R(a+bB_b)}\right](1 + \varepsilon_d)$$

with the percentage error $$\varepsilon_d = \frac{B_d^2}{8\pi^2 R^2 (a+bB_b)^4} \frac{1}{\cosh\frac{\mu_0 I}{2\pi R(a+bB_b)}} \left\{ \frac{2\pi R \mu_0 I b^2 (a+bB_b)}{\sinh\frac{\mu_0 I}{2\pi R(a+bB_b)}} - \frac{(\mu_0 I b)^2 + (2\pi R(a+bB_b))^2}{\cosh\frac{\mu_0 I}{2\pi R(a+bB_b)}} \right\}$$

The system determines the estimated current by I=(2/μ₀)πR (a+bB_b)arc tan h(AVG), where R is given by construction, a and b are parameters of the MR, and $B_b$ is the known bias field. Of course, the inverse hyperbolic function can be approximated by a series expansion or other mathematical procedures (e.g., such as spline interpolation or look-up tables).

In one example in which a=12 mT, b=1.25, the bias field is 15 mT, the disturbance field is 3 mT, and there is a reading radius R=8 mm, a percentage error of 0.25% is determined at small currents and even less at large currents. Thus, it can be seen that the percentage error can be maintained below about 1% when the bias magnetic field is at least five times greater than the disturbance field.

Thus, the algorithm for weak-field MRs is explained in the discussion related to FIG. 13, while the algorithm for strong-field MRs is discussed below. Both algorithms have similarities: sampling signals of all elements 120, computing their average, and deriving the current. The last step, however, uses different formulae: for strong-field MRs the equation includes a square-root, whereas for weak-field MRs equation includes a hyperbolic tangent. The signals of elements 120 are Sx' if elements 120 are perfectly aligned (in both cases Sx' is the output of a half-bridge or full-bridge circuit). If the elements 120 are not accurately aligned radially, an additional signal Sy' can be used (and which has been discussed for strong-field MRs, but the same applies for weak-field MRs). Generally speaking, if elements 120 are not accurately aligned both Sx' and Sy' can be used, whereby Sx' and Sy' are bridge outputs of MRs with different reference directions (i.e., not necessarily along +/−x' and +/−y', but all other directions are also possible, particularly for AMRs where the reference directions of MRs in each half-bridge are not anti-parallel but orthogonal and then the reference directions between different half-bridges are not at +/−90 degrees but at +/−45 degrees).

Figure 14:
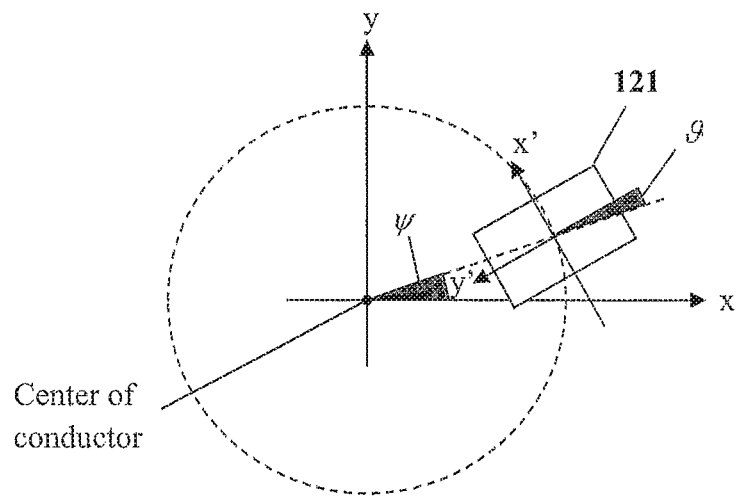
FIG. 14 is a top view of a sensor system according to an embodiment.

For example, and referring to FIG. 14, a single sensor die 121 at azimuthal position ψ is depicted. Though ideally sensor die 121 is aligned with the radial direction, in FIG. 14 a small misalignment υ is depicted due to, e.g., assembly tolerances. The transformation of magnetic flux density vectors between the two reference systems (x,y) and (x',y') is:

$$\begin{pmatrix} B_x \\ B_y \end{pmatrix} = \begin{pmatrix} -\sin(\psi + \vartheta) & -\cos(\psi + \vartheta) \\ \cos(\psi + \vartheta) & -\sin(\psi + \vartheta) \end{pmatrix} \begin{pmatrix} B_{x'} \\ B_{y'} \end{pmatrix}$$

from which the following can be derived:

$$\frac{B_y}{\sqrt{B_x^2 + B_y^2}} \cos\psi - \frac{B_x}{\sqrt{B_x^2 + B_y^2}} \sin\psi =$$

$$\frac{B_{x'}}{\sqrt{B_{x'}^2 + B_{y'}^2}} \cos\vartheta - \frac{B_{y'}}{\sqrt{B_{x'}^2 + B_{y'}^2}} \sin\vartheta = S_{x'}\cos\vartheta - S_{y'}\sin\vartheta = \sin\Delta\varphi$$

The rightmost identify in this equation means that sensor elements perfectly aligned to the bias field (i.e., for which υ=0) need only the signal Sx' and not Sy'.

Figure 15:
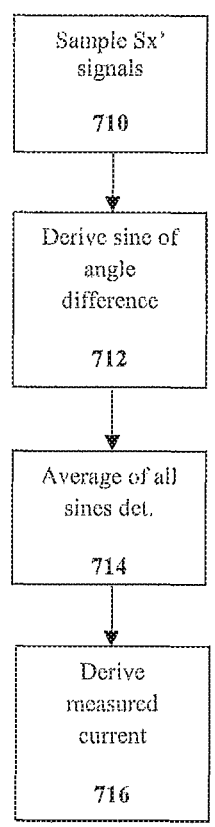
FIG. 15 is a flow chart according to an embodiment.

Referring then to FIG. 15, at 710 the signals Sx' of all N sensor elements 120 are sampled. Optionally, the signals Sy' of all N sensor elements 120 also can be sampled. At 712, the sine of the angle difference (sin Δφ) for all N sensor elements 120 is derived. At 714, the average of all sines of angle difference is determined, and at 716 the current is derived.

In more detail, assume a sensor element at position (R,psi), where the in-plane magnetic field is:

$$(F1):\ B_x(R, \psi) = \frac{-\mu_0 I}{2\pi} \frac{R\sin\psi - \varepsilon_R \sin\chi}{R^2 + \varepsilon_R^2 - 2R\varepsilon_R \cos(\psi - \chi)} + B_{b,x}(R, \psi) + B_{d,x}$$

$$(F2):\ B_y(R, \psi) = \frac{\mu_0 I}{2\pi} \frac{R\cos\psi - \varepsilon_R \cos\chi}{R^2 + \varepsilon_R^2 - 2R\varepsilon_R \cos(\psi - \chi)} + B_{b,y}(R, \psi) + B_{d,y}$$

where $\mu_0$ is the magnetic permeability of free space, I is the current to be measured, $(\epsilon_R, \chi)$ are radial and azimuthal coordinate of the center of the (e.g., circular) conductor, $B_{b,x}$ and $B_{b,y}$ are x- and y-components of the bias field of the magnet element on the position $(R,\psi)$, and $B_{d,x}$ and $B_{d,y}$ are the x- and y-components of a homogeneous magnetic disturbance. In an ideal case the bias field points exactly in the radial direction and is equally sized at all azimuthal locations:

$$B_{b,x}(R,\psi)=B_b \cos\psi, B_{b,y}(R,\psi)=B_b \sin\psi.$$

In practice, however, the bias magnets have some tolerance $B_b(\psi)$ and some small misalignment $\alpha$ so that:

$$B_{b,x}(R,\psi)=B_b(\psi)\cos(\psi+\alpha), B_{b,y}(R,\psi)=B_b(\psi)\sin(\psi+\alpha).$$

If we neglect all tolerances $\epsilon_R=\alpha=0$ and the magnetic disturbance $B_{d,x}=B_{d,y}=0$, the in-plane field becomes:

$$B_x(R, \psi) = \frac{-\mu_0 I}{2\pi} \frac{\sin\psi}{R} + B_b(\psi)\cos\psi, B_y(R, \psi) = \frac{\mu_0 I}{2\pi} \frac{\cos\psi}{R} + B_b(\psi)\sin\psi.$$

The angle between the radial direction $\vec{n}_R = \cos\psi \vec{n}_x + \sin\psi \vec{n}_y$, and the in-plane field $B_x\vec{n}_x + B_y\vec{n}_y$ is denoted by $\Delta\phi$. It is given by:

$$\begin{pmatrix}\cos\psi\\ \sin\psi\end{pmatrix} \wedge \begin{pmatrix}B_x(R, \psi)\\ B_y(R, \psi)\end{pmatrix} \frac{1}{\sqrt{B_x^2(R, \psi) + B_y^2(R, \psi)}} = \sin\Delta\varphi,$$

whereby $\wedge$ denotes the vector product. This is equivalent to:

$$\sin\Delta\varphi = \frac{B_y(R, \psi)}{\sqrt{B_x^2(R, \psi) + B_y^2(R, \psi)}}\cos\psi - \frac{B_x(R, \psi)}{\sqrt{B_x^2(R, \psi) + B_y^2(R, \psi)}}\sin\psi.$$

Inserting the two formulas (F1), (F2) above gives $$\sin\Delta\varphi = \frac{\mu_0 I}{2\pi R} / \sqrt{\left(\frac{\mu_0 I}{2\pi R}\right)^2 + (B_b)^2}$$

So, a possible sensor principle is to first measure $\sin \Delta\phi$ and then use the last equation to determine the current I.

Next, assume there is some small magnetic disturbance $B_{d,x}\neq 0$, $B_{d,y}\neq 0$ present. Then the formula for $\sin \Delta\phi$ (i.e. the sine of the difference between azimuthal position and angles of in-plane field) contains several terms with the disturbance field. Yet, if $$\frac{1}{2\pi}\int_{\psi=0}^{2\pi}\sin\Delta\varphi d\psi$$

is determined the same result $$\frac{\mu_0 I}{2\pi R} / \sqrt{\left(\frac{\mu_0 I}{2\pi R}\right)^2 + (B_b)^2}$$

results, which proves that homogeneous disturbances are canceled out of the signal $$\frac{1}{2\pi}\int_{\psi=0}^{2\pi}\sin\Delta\varphi d\psi.$$

In practice this signal cannot be determined in a strict sense because $\sin \Delta\phi$ would need to be sampled infinitely densely on the reading circle. So the integral can be approximated by a sum over N terms:

$$\frac{1}{2\pi}\int_{\psi=0}^{2\pi}\sin\Delta\varphi d\psi = \frac{1}{N}\sum_{m=0}^{N-1}\sin\Delta\varphi\Big|_{\psi=2\pi m/N}.$$

Thus, generally, the sensor system comprising strong-field MRs samples the values $$\frac{B_y(R, \psi)}{\sqrt{B_x^2(R, \psi) + B_y^2(R, \psi)}}\cos\psi - \frac{B_x(R, \psi)}{\sqrt{B_x^2(R, \psi) + B_y^2(R, \psi)}}\sin\psi$$

at the azimuthal coordinates $\psi=2\pi m/N$ for $m=0, 1, \ldots, N-1$. Then it determines their average AVG and sets it equal to $$\frac{\mu_0 I}{2\pi R} / \sqrt{\left(\frac{\mu_0 I}{2\pi R}\right)^2 + (B_b)^2}.$$

This equality is solved for I, which is the output for the measured current:

$$I = \frac{2\pi R |B_b|}{\mu_0} \frac{AVG}{\sqrt{1-AVG^2}}.$$

The radial distance R is given by construction.

The result is proportional to the bias magnetic field. If the bias magnetic field is inaccurate (e.g., it drifts over temperature or lifetime), the result will also drift accordingly. Therefore, it can be advantageous to use bias magnets that are highly stable (e.g., rare-earth types of magnets, such as SmCo magnets with low temperature coefficient). Conversely, it is also possible to add a magnetic field sensor, such as a Hall plate or a vertical Hall sensor that has low zero-point error (e.g., below 50 µT), is highly stable over temperature and lifetime (e.g., drift less than 1%) and is not affected by crosstalk of orthogonal magnetic field components, to measure the strength of the bias magnet continuously or at regular intervals. This value can be communicated to the algorithm that determines the current (so $B_b$ or at least its component in the radial direction is measured and inserted in the formula for I).

A simpler approach can be to add a temperature sensor to each (or at least one) angle sensor in embodiments. The temperature sensor can measure the temperature of the bias magnet, and the algorithm can account for systematic temperature dependence of the bias magnet. If the sensor elements are MR full- or half-bridge circuits, their current consumption at a fixed supply voltage has a well-defined temperature dependence, such that the MRs themselves can be used as such a temperature sensor.

Background magnetic field suppression can be improved when the disturbance field is small relative to the bias field. This sets a lower bound for useful bias fields. Moreover, many types of strong-field MRs need a minimum field (e.g., about 10 mT or 20 mT) to work accurately. At vanishing current only the bias field is left and thus it should not be too small in embodiments. Thus, the bias field should be large enough, even though the system still works at excessive over-currents when the field of the current is much larger than the bias field.

On the other hand, a large bias field can mean that the measured angle difference $\Delta\phi$ is small. Since most MRs exhibit some zero-point error (e.g., due to mismatch of elements or small asymmetries of the sensors) this results in a zero-point error of measured current. This offset current is larger if the full-scale swing of $\Delta\phi$ is small, i.e., at large bias field. Therefore, it can be advantageous for the bias field not to be excessively large. In other words, zero-point accuracy and background field cancelation are competing challenges in sensor system design and implementation but can be balanced in embodiments or adjusted in situations in which one or the other is more important, easier to control, or according to some other factor.

Embodiments also can consider robustness with respect to position tolerances between the conductor and the sensor system, as already mentioned herein. For example, recall equations (F1) and (F2) above. Equations (F1) and (F2) can be developed into Taylor Series for small $\epsilon_R$ up to second order with $\alpha = B_d = 0$ (i.e., perfectly aligned bias fields and vanishing disturbance field). Then we determine:

$$\frac{1}{N}\sum_{m=0}^{N-1}\frac{B_y(R,\psi)}{\sqrt{B_x^2(R,\psi)+B_y^2(R,\psi)}}\cos\psi - \frac{B_x(R,\psi)}{\sqrt{B_x^2(R,\psi)+B_y^2(R,\psi)}}\sin\psi$$

for $\psi = 2\pi m/N$. For N=3, 4, 5 . . . , the result is:

$$\frac{\mu_0 I}{\sqrt{(\mu_0 I)^2 + (2\pi R B_b)^2}}\left(1 - \frac{1}{4}\left(\frac{\epsilon_R}{R}\right)^2\frac{(\mu_0 I)^2}{(\mu_0 I)^2 + (2\pi R B_b)^2}\right),$$

where the second term in the brackets is the percentage error due to position tolerance. It is quadratic in $\epsilon_R/R$ and decreases quadratically with large bias fields at small and moderate currents, whereas it tends to a maximum of $\epsilon_R^2/(2R)^2$ for large currents. For an example embodiments of R=8 mm, $\epsilon_R$=1 mm, $B_b$ #15 mT and I=1000 A, it is 0.3%, which is quite good. Moreover, any sensor system that is robust against small placement errors of the conductor is at the same time robust against errors due to conductor cross-sections deviating from rotational symmetry.

For robustness against external magnetic disturbances, the calculation can be repeated for $\epsilon_R = \alpha = 0$ and $B_d \neq 0$, with (F1) and (F2) developed up to second order in $B_d$. For N=3, 4, 5 . . . , it follows that:

$$\frac{1}{N}\sum_{m=0}^{N-1}\frac{B_y(R,\psi)}{\sqrt{B_x^2(R,\psi)+B_y^2(R,\psi)}}\cos\psi - \frac{B_x(R,\psi)}{\sqrt{B_x^2(R,\psi)+B_y^2(R,\psi)}}\sin\psi =$$

-continued $$\frac{\mu_0 I}{\sqrt{(\mu_0 I)^2 + (2\pi R B_b)^2}}\left(1 - \frac{(\pi R B_d)^2}{(\mu_0 I)^2 + (2\pi R B_b)^2}\right)$$

The disturbance does not lead to an additive error (e.g., offset or zero-point error) but rather only to multiplicative (e.g., gain) error, which is largest at small currents and where the percentage error is given by the second term in the brackets: $(B_d/(2B_b))^2$. So, the ratio of disturbance over bias field can be decisive. The error is less than 1% if the bias field is at least five times larger than the disturbance. Thus, a bias field of 15 mT can keep the error due to homogeneous disturbances up to 3 mT below 1%.

Thus, embodiments of coreless magnetic field current sensors, systems and methods are disclosed. In embodiments, the sensors, systems and/or methods can be used to determine, estimate or infer a current in a conductor, or to determine, estimate or infer at least one parameter of the current, such as its magnitude, sign, whether it is above or below a particular threshold, the rms value of an AC current, or some other desired parameter or characteristic.

Various embodiments of systems, devices and methods have been described herein. These embodiments are given only by way of example and are not intended to limit the scope of the invention. It should be appreciated, moreover, that the various features of the embodiments that have been described may be combined in various ways to produce numerous additional embodiments. Moreover, while various materials, dimensions, shapes, configurations and locations, etc. have been described for use with disclosed embodiments, others besides those disclosed may be utilized without exceeding the scope of the invention.

Persons of ordinary skill in the relevant arts will recognize that the invention may comprise fewer features than illustrated in any individual embodiment described above. The embodiments described herein are not meant to be an exhaustive presentation of the ways in which the various features of the invention may be combined. Accordingly, the embodiments are not mutually exclusive combinations of features; rather, the invention can comprise a combination of different individual features selected from different individual embodiments, as understood by persons of ordinary skill in the art. Moreover, elements described with respect to one embodiment can be implemented in other embodiments even when not described in such embodiments unless otherwise noted. Although a dependent claim may refer in the claims to a specific combination with one or more other claims, other embodiments can also include a combination of the dependent claim with the subject matter of each other dependent claim or a combination of one or more features with other dependent or independent claims. Such combinations are proposed herein unless it is stated that a specific combination is not intended. Furthermore, it is intended also to include features of a claim in any other independent claim even if this claim is not directly made dependent to the independent claim.

Any incorporation by reference of documents above is limited such that no subject matter is incorporated that is contrary to the explicit disclosure herein. Any incorporation by reference of documents above is further limited such that no claims included in the documents are incorporated by reference herein. Any incorporation by reference of documents above is yet further limited such that any definitions provided in the documents are not incorporated by reference herein unless expressly included herein.

For purposes of interpreting the claims for the present invention, it is expressly intended that the provisions of Section 112, sixth paragraph of 35 U.S.C. are not to be invoked unless the specific terms "means for" or "step for" are recited in a claim.

What is claimed is:

1. A method comprising:
arranging a sensor system proximate a conductor, the sensor system comprising a plurality N of magnetoresistive (MR) sensors arranged on a circle concentric to a center of the conductor and spaced apart from one another by 360 degrees/N;
providing a bias magnetic field on the plurality of MR sensors;
causing a current to flow in the conductor; and
sensing a magnetic field induced by the current and acting on each of the plurality of MR sensors; and
estimating at least one parameter of the current in the conductor by combining signals related to the magnetic field from each of the plurality of MR sensors using circuitry,
wherein the arranging further comprises arranging at least one magnetic element of the sensor system proximate the plurality of MR sensors, and wherein the providing further comprises providing a bias magnetic field on the plurality of MR sensors by the at least one magnetic element,
wherein the at least one magnetic element comprises N magnetic elements, and each of the N MR sensors has an associated one of the N magnetic elements.

2. The method of claim 1, wherein the estimating further comprises using a sensed characteristic related to the bias magnetic field to estimate the current in the conductor.

3. The method of claim 1, wherein each MR sensor has a sensitivity plane and is responsive to a projection of the magnetic field into the sensitivity plane, the sensitivity planes of the plurality of MR sensors being parallel, and wherein the plurality of MR sensors are arranged relative to the conductor such that the magnetic field has a non-vanishing component parallel to the sensitivity plane.

4. The method of claim 1, wherein the plurality of MR sensors are arranged on a support structure.

5. The method of claim 1, wherein at least one magnetic element is arranged to provide a bias magnetic field on the plurality of MR sensors.

6. The method of claim 1, wherein N is greater than or equal to 2.

7. The method of claim 1, wherein each MR sensor comprises a half-bridge circuit of magnetoresistors.

8. The method of claim 7, wherein each MR sensor comprises a sensor die and the half-bridge circuit is arranged on the sensor die.

9. The method of claim 1, wherein the plurality of MR sensors comprise weak-field or strong-field MR sensors.

10. The method of claim 5, wherein the support structure comprises an aperture, and wherein the conductor is arranged in the aperture.

11. The method of claim 10, wherein the aperture extends inwardly from a side of the support structure.

12. A method comprising:
arranging a sensor system proximate a conductor, the sensor system comprising a plurality N of magnetoresistive (MR) sensors arranged on a circle concentric to a center of the conductor and spaced apart from one another by 360 degrees/N;
providing a bias magnetic field on the plurality of MR sensors;
causing a current to flow in the conductor; and
sensing a magnetic field induced by the current and acting on each of the plurality of MR sensors; and
estimating at least one parameter of the current in the conductor by combining signals related to the magnetic field from each of the plurality of MR sensors using circuitry, and
wherein the at least one magnetic element comprises a single permanent magnet having an aperture, and wherein the conductor is arranged in the aperture of the support structure and in the aperture of the single permanent magnet,
wherein a center of the aperture is aligned with the center of the conductor.

13. The method of claim 1, wherein the plurality of MR sensors are selected from the group consisting of: tunneling MRs (TMRs); giant MRs (GMRs); anisotropic MRs (AMRs) and colossal MRs (CMRs).

14. The method of claim 1, wherein directions of the bias magnetic fields on adjacent ones of the plurality of MR sensors differ by an angle of 360 degrees/N.

15. The method of claim 1, wherein a ratio of a magnetic field related to the current in the conductor sensed by one of the plurality of MR sensors to the bias magnetic field on the one of the plurality of MR sensors is the same for each of the plurality of MR sensors.

* * * * *